(12) United States Patent
Crowley et al.

(10) Patent No.: US 10,699,885 B2
(45) Date of Patent: Jun. 30, 2020

(54) DUAL POWER FEED ROTARY SPUTTERING CATHODE

(71) Applicant: Bühler AG, Uzwil (CH)

(72) Inventors: Daniel Theodore Crowley, Owatonna, MN (US); Patrick Lawrence Morse, Tucson, AZ (US)

(73) Assignee: Bühler AG, Uzwil (CH)

( * ) Notice: Subject to any disclaimer, the term of this patent is extended or adjusted under 35 U.S.C. 154(b) by 0 days.

(21) Appl. No.: 15/507,207

(22) PCT Filed: Aug. 28, 2015

(86) PCT No.: PCT/US2015/047452
§ 371 (c)(1),
(2) Date: Feb. 27, 2017

(87) PCT Pub. No.: WO2016/033475
PCT Pub. Date: Mar. 3, 2016

(65) Prior Publication Data
US 2017/0278685 A1    Sep. 28, 2017

Related U.S. Application Data

(60) Provisional application No. 62/043,711, filed on Aug. 29, 2014.

(51) Int. Cl.
*H01J 37/34* (2006.01)
(52) U.S. Cl.
CPC ........ *H01J 37/3435* (2013.01); *H01J 37/342* (2013.01); *H01J 37/3417* (2013.01); *H01J 37/3423* (2013.01); *H01J 37/3444* (2013.01); *H01J 37/3464* (2013.01)

(58) Field of Classification Search
CPC .... H01J 37/347; H01J 37/342; H01J 37/3464; H01J 37/3417; H01J 37/3435; H01J 37/3444; H01J 37/3423
See application file for complete search history.

(56) References Cited

U.S. PATENT DOCUMENTS

| 4,931,169 A | 6/1990 | Scherer et al. |
| 5,096,562 A | 3/1992 | Boozenny et al. |
| 5,948,215 A | 9/1999 | Lantsman |

(Continued)

FOREIGN PATENT DOCUMENTS

| EP | 3032565 A1 * | 6/2016 | ........ H01J 37/32082 |
| KR | 20100115180 | 10/2010 | |

OTHER PUBLICATIONS

John Crane shaft seal, type 21 [Accessed on Sep. 30, 2019].*

(Continued)

*Primary Examiner* — Michael A Band
(74) *Attorney, Agent, or Firm* — Fogg & Powers LLC

(57) ABSTRACT

A rotary sputtering cathode assembly is provided that comprises a rotatable target cylinder having a first end and an opposing second end. A first power transfer apparatus is configured to carry radio frequency power to the first end of the target cylinder, and a second power transfer apparatus is configured to carry radio frequency power to the second end of the target cylinder. Radio frequency power signals are simultaneously delivered to both of the first and second ends of the target cylinder during a sputtering operation.

10 Claims, 7 Drawing Sheets

(56) References Cited

U.S. PATENT DOCUMENTS

| | | |
|---|---|---|
| 6,365,009 B1 | 4/2002 | Ishibashi |
| 7,247,221 B2 | 7/2007 | Stowell, Jr. |
| 8,562,799 B2 | 10/2013 | Dellaert et al. |
| 2010/0243428 A1 | 9/2010 | Crowley |
| 2013/0008777 A1 | 1/2013 | Choquette et al. |
| 2013/0248352 A1 | 9/2013 | Jiang et al. |
| 2014/0183037 A1 | 7/2014 | Xie et al. |

OTHER PUBLICATIONS

International Search Authority, "International Search Report for PCT/US2015/047452", "from U.S. Appl. No. 62/043,711", dated Dec. 8, 2015, pp. 1-12, Published in: WO.

German et al., "RF Sputtering of ITO on Rotary Cathodes", The Society of Vacuum Coaters Conference, May 5, 2014, pp. 1-5, Published in: Chicago, IL.

Heimke et al., "ITO Thin Films Prepared by Synchronal Pulsed RF-DC Sputtering", 25th European Photovoltaic Solar Energy Conference and Exhibition/5th World Conference on Photovoltaic Energy Conversion, Sep. 3-10, 2010, pp. 3099-3102, Published in: Valencia, Spain.

\* cited by examiner

DUAL POWER FEED ROTARY SPUTTERING CATHODE

CROSS-REFERENCE TO RELATED APPLICATIONS

This application is a U.S. National Stage Application of PCT Application Serial No. PCT/US2015/047452, filed Aug. 28, 2015, which claims benefit of U.S. Provisional Application Ser. No. 62/043,711, filed on Aug. 29, 2014, the contents of both of which are incorporated by reference.

BACKGROUND

Magnetron sputtering of rotating targets is well known and is used extensively for producing a wide variety of thin films on a wide variety of substrates. In the most basic form of rotating-target magnetron sputtering, the material to be sputtered from the target is either formed in the shape of a tube or is adhered to the outer surface of a support tube made of a rigid material. A magnetron assembly is disposed within the target and supplies a magnetic field, which permeates the target such that there is adequate magnetic flux at the outer surface of the target. The magnetic field is designed in a way such that it retains electrons emitted from the target so as to increase the probability that the electrons will have ionizing collisions with a working gas, hence enhancing the efficiency of the sputtering process.

A common class of materials deposited by magnetron sputtering is transparent conductive oxides (TCOs). The most commonly used TCO is indium tin oxide (ITO). ITO can be sputtered reactively, wherein a metal target is sputtered in an oxidizing atmosphere. However, sputtering ITO from a ceramic target is frequently preferred because its process is much easier to control. This results in more consistent high-quality films, compared with reactive sputtering. Planar targets have historically been preferred for ITO sputtering due to the lower fabrication costs compared to rotary ceramic targets.

In recent years, there has been a trend away from planar ITO target and towards rotary targets. This trend is a result of improved fabrication techniques that lower the cost of rotary ceramic targets, improved magnetron designs that increase the efficiency of material use, and the rotary cathode's superior operating performance, which helps satisfy increasing market demand for high quality films. Additionally, rotary targets hold a larger useable quantity of the sputtering material. This allows for reduced system maintenance requirements and, hence, better machine efficiency.

A sputtering method involving simultaneous application of direct current (DC) (or pulsed DC) power and radio frequency (RF) power has recently been applied to ITO targets. It has been demonstrated that improvement in the ITO film qualities resulted from the superposition of the two power sources using a planar target. The frequency of the power source used was 13.56 MHz, which is the most common frequency used for RF power in sputtering operations.

In another approach to applying RF power to a rotary cathode, RF energy is imparted into a target by transmitting an RF power signal via an antenna located within the rotating target. Here, the antenna is static and thus does not require a power transfer apparatus to move the power from static to rotating elements. This approach also disallows the superposition of DC power onto the RF driven target.

Recently, it has been shown that the application of RF power to a rotary cathode results in an unacceptable non-uniformity of the deposited film thickness. The non-uniformity is thought to be due to power (or voltage) attenuation, along the length of the cathode, resulting from the reactive impedance of the high-frequency of the applied voltage.

Accordingly, there remains a need for the capability of the application of RF power to rotary sputtering cathodes that addresses the issue of non-uniformity of deposited films.

SUMMARY

A rotary sputtering cathode assembly is provided that comprises a rotatable target cylinder having a first end and an opposing second end. A first power transfer apparatus is configured to carry radio frequency power to the first end of the target cylinder, and a second power transfer apparatus is configured to carry radio frequency power to the second end of the target cylinder. Radio frequency power signals are simultaneously delivered to both of the first and second ends of the target cylinder during a sputtering operation.

DRAWINGS

DETAILED DESCRIPTION

Figure 1:
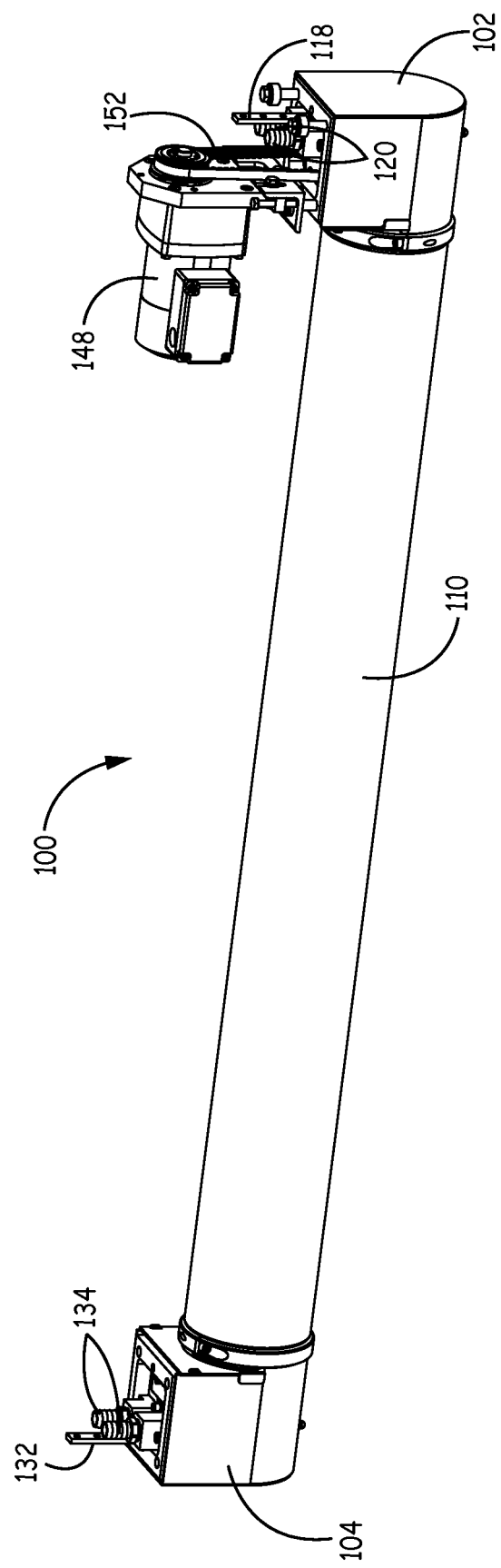
FIG. 1 is a perspective view of a rotary sputtering cathode assembly according to one embodiment.

An apparatus and method for the application of radio frequency (RF) power to rotary sputtering cathodes is provided. In particular, equipment and methodology are provided for applying RF power, which results in symmetric film deposition.

A rotary sputtering cathode generally comprises one or more end-blocks and a target assembly. The end-blocks are the mechanical apparatus that support the target assembly and provide the interface between the target and supporting utilities, such as power, rotation, and cooling water. The target assembly generally includes a target cylinder, with an outer surface composed of a material to be sputtered, and a magnet element within the target cylinder. The magnet element provides a magnetic field that permeates the target cylinder such that there is a useful magnetic field at the outer surface of the target cylinder.

There are two basic types of rotary cathodes, including a dual end-block type rotary cathode and a single end-block type rotary cathode. Both types of rotary cathodes have a common set of components that include, but are not necessarily limited to, bearings that support the target assembly while allowing rotation relative to the end-block(s); rotary seals that provide separation between vacuum and water, or between vacuum and atmosphere; a rotation drive apparatus that imparts rotating motion to the target assembly; cooling water delivery apparatus; and a rotary power transfer apparatus or interface that transmits power from a static element to the rotating target assembly.

In the dual end-block rotary cathode, the apparatus for rotation, power transfer, and water delivery (collectively, the utility apparatus) are divided between the two ends. Additionally, both end-blocks have at least one of the bearings and rotary seals. The single end-block cathode has all of the utility apparatus, as well as the rotary seals and the bearings, in a single mechanical apparatus at one end of the target assembly. Optionally, the single end-block cathode may be augmented with a target support at the distal end, which may be construed as a rotary bearing. The distal end of the single end-block cathode will generally not have any other components required for operation.

Conventional rotary cathodes provide apparatus for rotation, water delivery, and power transfer at only one end or the other end of the target assembly. In some cases, such as in the use of RF power, applying power to only one end of the cathode results in unacceptable non-uniformity of the sputtering/deposition process. For example, while the application of RF power to a rotary indium tin oxide (ITO) target significantly improves the quality of the deposited ITO film, it is still necessary to overcome the non-uniformity issue in order to make the technique feasible for industrial use.

The present approach resolves this issue by supplying power signals to both ends of the target cylinder in the cathode assembly. This achieves acceptable deposition uniformity while operating the cathode assembly with RF power. In addition, the present system can provide symmetric and even power application to both ends of the sputtering target cylinder, resulting in improved uniformity.

In one embodiment, a second power transfer apparatus is implemented at the opposite end of the target cylinder from a first power transfer apparatus, allowing for a two-ended power feed to both ends of the target cylinder. This results in a symmetric film deposition and uniformity during a sputtering operation.

In one implementation, the two-ended power feed embodiment can be achieved by using two end-blocks for a single end-block type rotary cathode, arranged with one end-block at each end of the target cylinder. The power is supplied to the target cylinder from the power transfer apparatus in each of the end-blocks. An example of a suitable end-block for this arrangement is the MC style end-block, produced by Sputtering Components, Inc. (SCI), which are typically used in single-ended rotary cathodes. This arrangement results in redundancy of the water delivery and rotation apparatus. While only one rotation apparatus is needed, it is desirable to allow the flow of cooling water through the second end-block in order to cool and lubricate the power transfer apparatus within. This can readily be achieved by connecting the water outlet to the inlet on the second end-block.

An alternate arrangement for achieving the two-ended power feed is to use one end-block from a single end-block type cathode in conjunction with a power delivering end-block from a two end-block type cathode. An example of a suitable arrangement comprises SCI's MC cathode, at one end, and the power end-block from SCI's TC cathode at the other end. The power end-block of the TC cathode also has the desired water delivery apparatus, thereby allowing cooling and lubricating of the power transfer apparatus. As the power end-block of the TC cathode does not have a rotation apparatus, there is no redundancy of the rotation drive in this arrangement.

Additional alternate suitable arrangements may be provided through custom designs that provide power transfer feeds to both ends of the target cylinder. In most cases, the second power transfer apparatus may require water flow for cooling and lubrication. A water requirement also implies the need for rotary seals. In other embodiments, a power transfer apparatus may not require the presence of water. Alternately, a specially designed secondary end can be implemented to provide power delivery to the outboard end of the cathode.

In one implementation, RF power may be applied to the two ends of any suitable cathode arrangement by the use of two separate power supplies. In this arrangement, the power supplies can be synchronized such that the applied voltages are substantially in phase in order to help ensure that there is minimal destructive interference of the two voltage waves. Synchronization also prevents undesired feedback from one power supply to the other.

In another implementation, RF power delivery is provided by splitting the output from a single power source. For example, a bus bar can be provided between the two end-blocks, with a power tap substantially at the center point of the bus bar such that the conduction path to each end of the target cylinder is essentially equal. Although this arrangement may generally be adequate, it is possible that there may be significant differences in the conduction paths to the two ends of the target cylinder. For example, this may occur if there is a variation in the two end-blocks, such as in the configuration that uses a combination of MC and TC cathode components. It is possible that other, less predictable, outside influences can also affect the conductance to the cathode. To counteract any potential asymmetry of power delivery, an optional power splitting circuit can be added between the RF power source and the target cylinder. This circuit can be designed such that it forces an equal amount of current to each end of the target cylinder, and can tune the power directed to each end to affect uniformity of target material deposition.

RF power sources generally include a generator that provides power at the prescribed frequency, and a load match circuit that conditions the power signal such that the output impedance of the source matches the input impedance of the sputtering process, thus ensuring optimal power delivery efficiency to the process. In one embodiment, superposition of RF and DC power can be applied to a rotary ITO sputtering target, which produces a superior film compared to DC sputtering alone. The present approach can use any frequency for the power signal for which a benefit can be realized.

In another embodiment, a power transfer interface can be located in the cooling water of the target cylinder. In a further embodiment, the main end-block body can be at cathode potential.

Further details of various embodiments are described hereafter with reference to the drawings.

Figure 2:
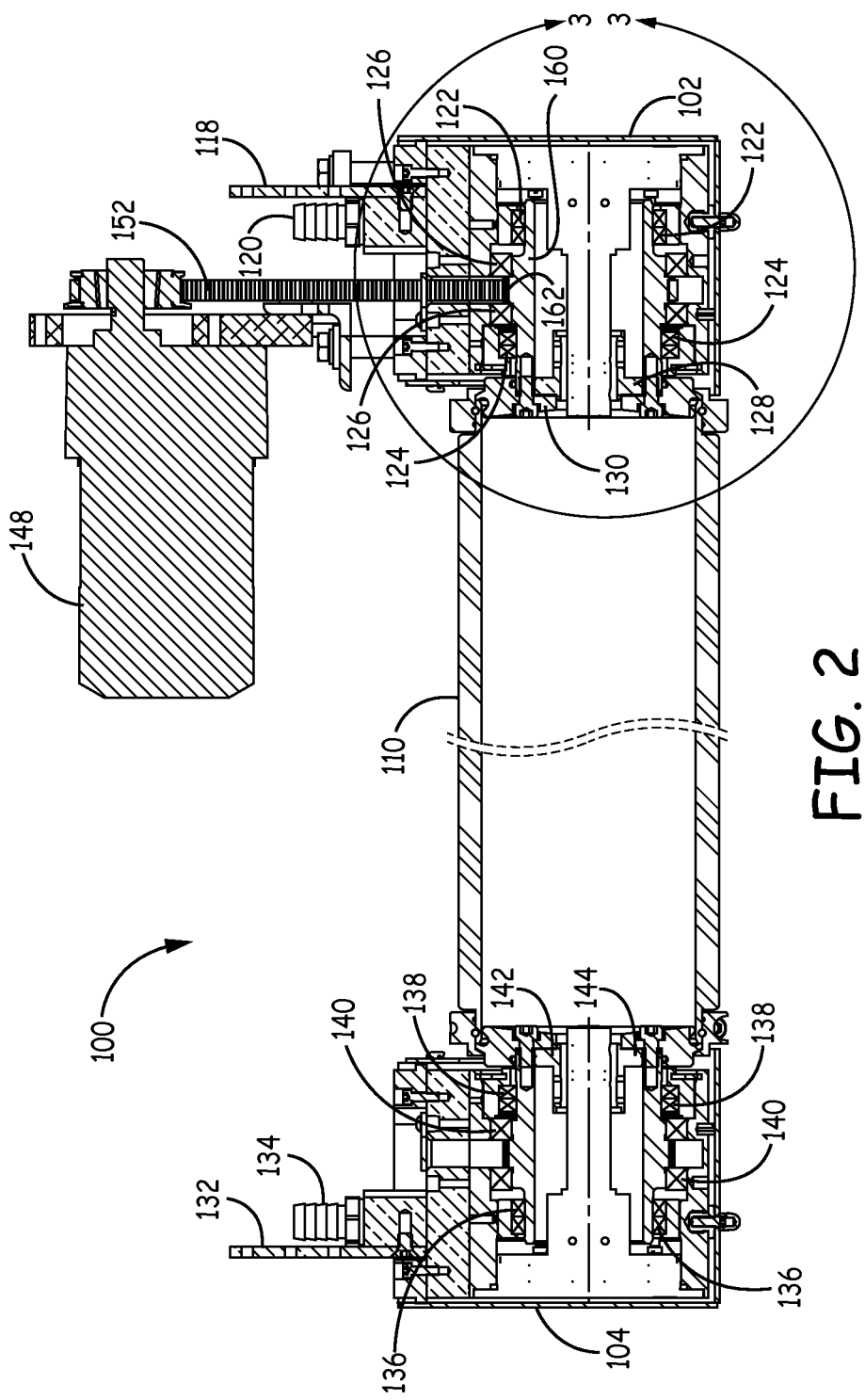
FIG. 2 is a partial cross-sectional side view of the rotary sputtering cathode assembly of FIG. 1.
Figure 3:
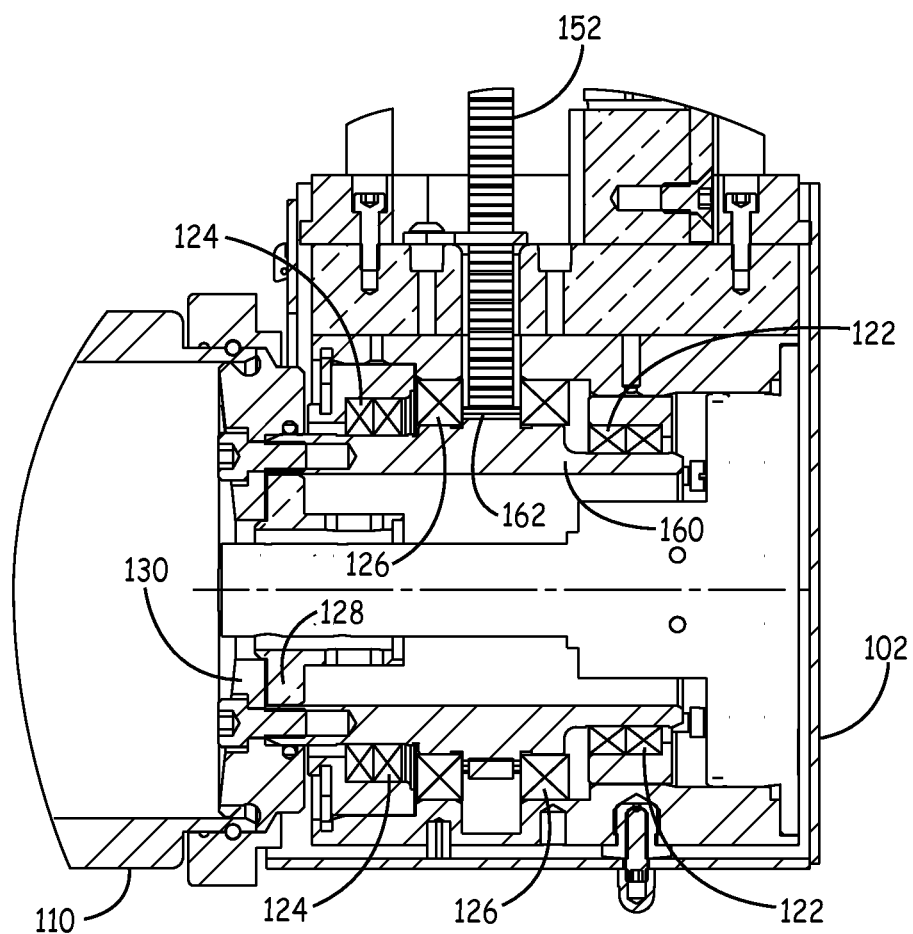
FIG. 3 is an enlarged cross-sectional side view of one end of the rotary sputtering cathode assembly taken along line 3-3 of FIG. 2.

FIGS. 1-3 illustrate a rotary cathode assembly 100 according to one embodiment. The rotary cathode assembly 100 includes a pair of end-blocks 102 and 104, which are located on opposing ends of a sputtering target cylinder 110. The target cylinder 110 is rotatable around a stationary magnet bar assembly, which is suspended inside of target cylinder 110 and coupled to a coolant water tube.

In one embodiment, target cylinder 110 has a target material on an outer surface thereof. Alternatively, target cylinder 110 can be composed of the target material. Exemplary target materials for target cylinder 110 include transparent conductive oxides (TCOs), such as indium tin oxide (ITO).

The end-block 102 includes a power bus 118 that is configured for connection to a power supply. A set of water tube connectors 120 is configured to supply water into and out of end-block 102, which communicates with the water tube as part of the cooling water delivery apparatus for target cylinder 110.

As shown in FIGS. 2 and 3, a set of rotary water seals 122 located in end-block 102 provides separation between water and atmosphere. A set of rotary vacuum seals 124 located in end-block 102 provides separation between vacuum and atmosphere. A set of bearings 126 in end-block 102 supports target cylinder 110 while allowing rotation of target cylinder 110 relative to end-block 102. The end-block 102 also houses an electrical stator 128 in electrical communication with power bus 118. The stator 128 operatively communicates with an electrical rotor 130 coupled to target cylinder 110 such that power is transmitted from stator 128 to rotor 130 to provide power to target cylinder 110.

Similarly, end-block 104 includes a power bus 132 that is configured for connection to a power supply, and a pair of tube water connectors 134 configured to supply water into and out of end-block 104, which communicates with the water tube in target cylinder 110. As shown in FIG. 2, a set of rotary water seals 136 located in end-block 104 provides separation between vacuum, water, and atmosphere. A set of rotary vacuum seals 138 located in end-block 104 provide separation between vacuum and atmosphere. A set of bearings 140 in end-block 104 also support target cylinder 110 while allowing rotation of target cylinder 110 relative to end-block 104. In addition, a static electrical contact 142 in end-block 102 is in electrical communication with power bus 132. The static electrical contact 142 communicates with a rotary electrical contact 144 coupled to target cylinder 110 such that power is transmitted to target cylinder 110.

A rotation drive motor 148 is operatively coupled to end-block 102 to impart rotating motion to target cylinder 110. The drive motor 148 is typically located outside of a vacuum chamber that houses target cylinder 110 and end-blocks 102, 104. The drive motor 148 engages with a rotation drive belt 152 that extends into end-block 102 as part of the rotation drive apparatus for target cylinder 110. As depicted in FIGS. 2 and 3 end-block 102 houses a rotary drive shaft 160 that is operatively coupled to target cylinder 110. A drive gear 162 is connected to drive belt 152 and is hobbed into drive shaft 160.

Figure 4:
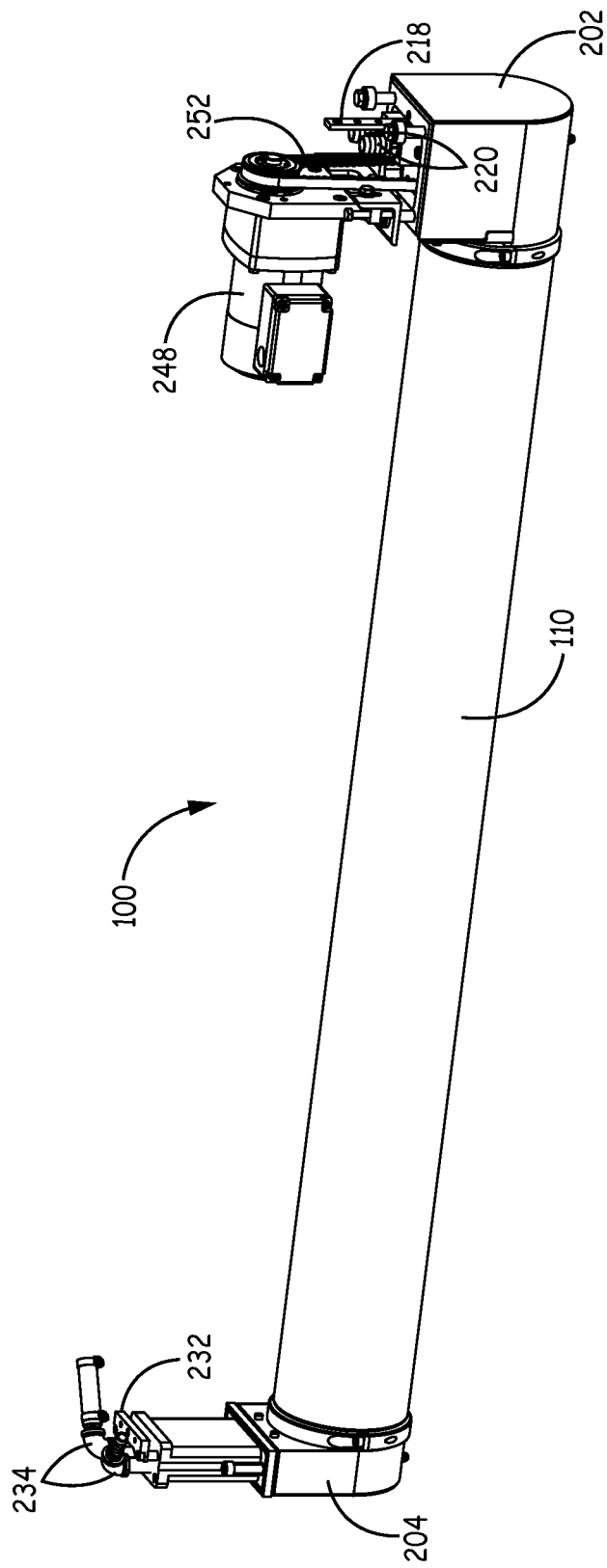
FIG. 4 is a perspective view of a rotary sputtering cathode assembly according to another embodiment.
Figure 5:
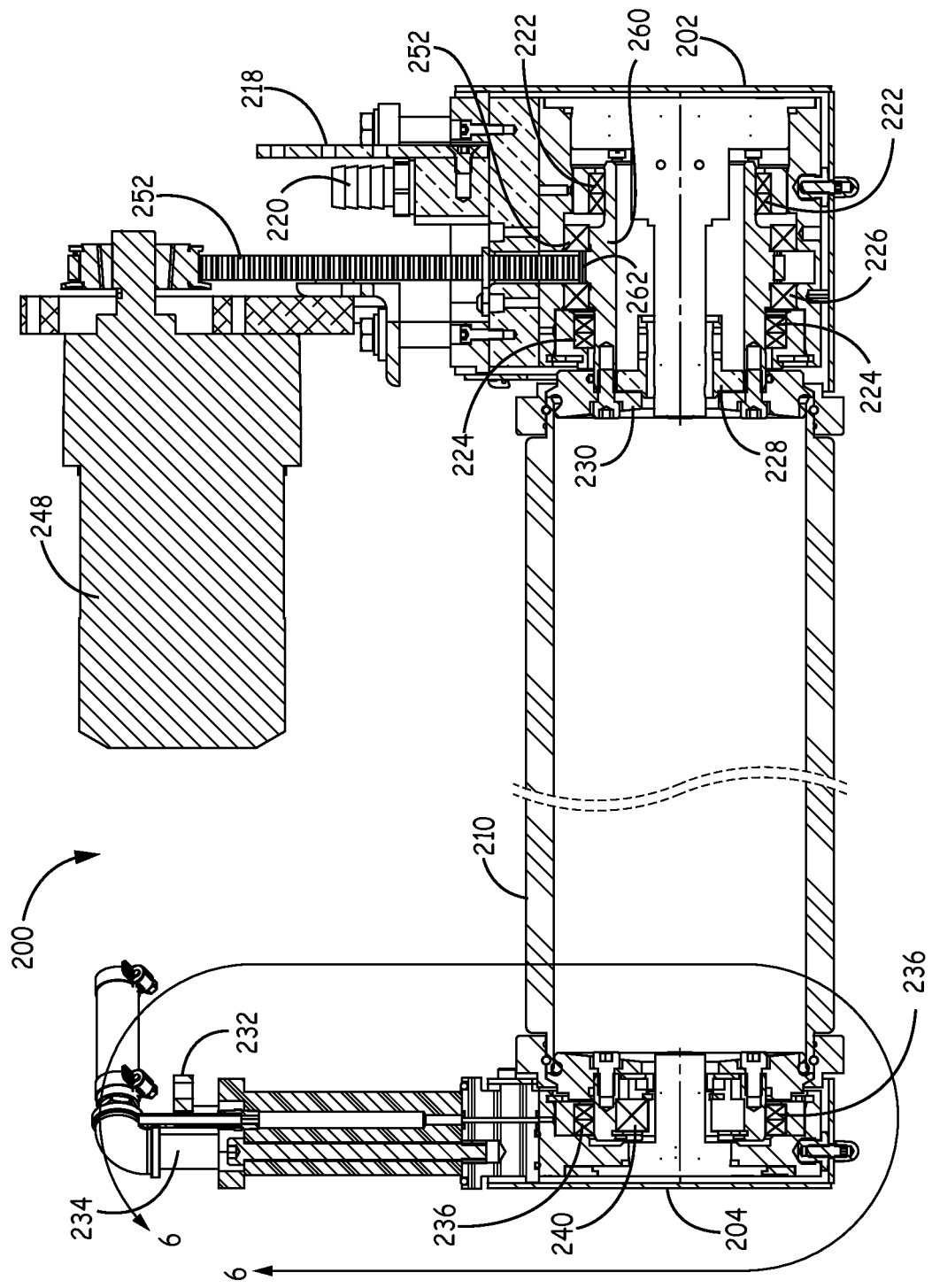
FIG. 5 is a partial cross-sectional side view of the rotary sputtering cathode assembly of FIG. 4.
Figure 6:
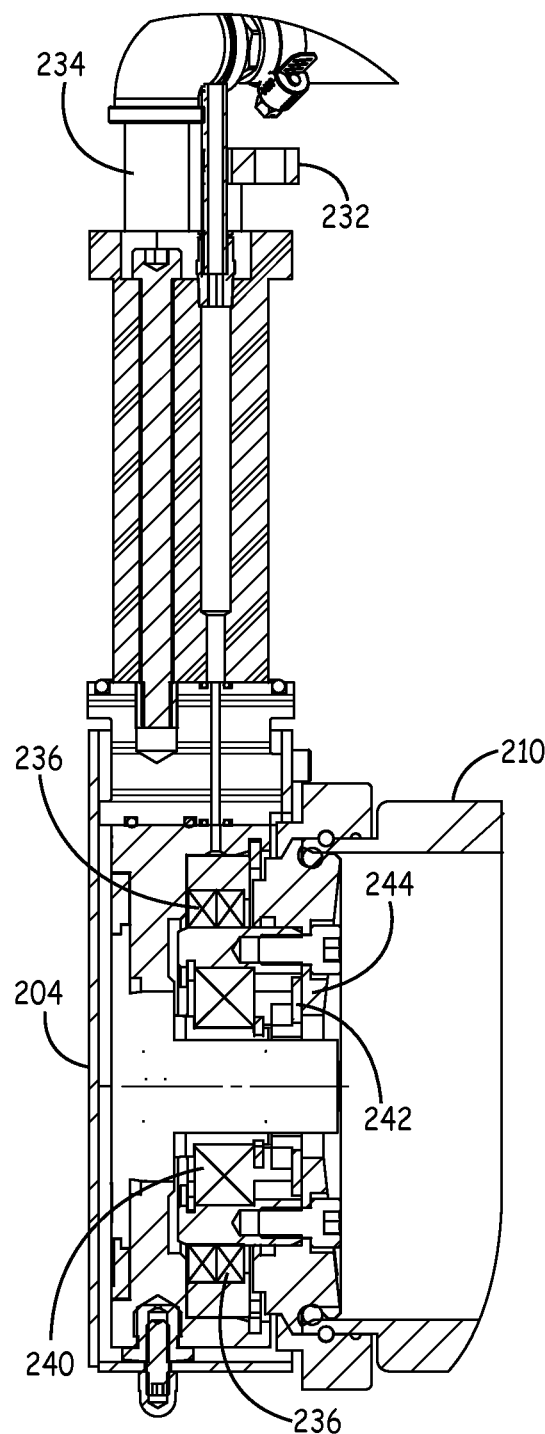
FIG. 6 is an enlarged cross-sectional side view of one end of the rotary sputtering cathode assembly taken along line 6-6 of FIG. 5.

FIGS. 4-6 illustrate a rotary cathode assembly 200 according to another embodiment. The rotary cathode assembly 200 includes a first end-block 202 and a second end-block 204 located on opposing ends of a sputtering target cylinder 210. The target cylinder 210 is rotatable around a stationary magnet bar assembly, which is suspended inside of target cylinder 210 and coupled to a coolant water tube.

The end-block 202 includes similar components as end-block 102 described previously. Accordingly, end-block 202 includes a power bus 218 that is configured for connection to a power supply. A set of water tube connectors 220 is configured to supply water into and out of end-block 202, which communicates with the water tube as part of the cooling water delivery apparatus for target cylinder 210.

As depicted in FIG. 5, a set of rotary water seals 222 located in end-block 202 provides separation between water and atmosphere. A set of rotary vacuum seals 224 located in end-block 202 provides separation between vacuum and atmosphere. A set of bearings 226 in end-block 202 supports target cylinder 210 while allowing rotation of target cylinder 210 relative to end-block 202.

In addition, a static contact plate 228 in end-block 202 is in electrical communication with power bus 218. The static contact plate 228 electrically communicates with a rotary contact plate 230 on a target flange of target cylinder 210 such that power is transmitted to target cylinder 210.

The end-block 204 includes a power bus 232 that is configured for connection to a power supply. A pair of water connectors 234 is configured to supply water into and out of end-block 204, which communicates with the water tube in target cylinder 210. As shown in FIGS. 5 and 6, a set of water seals 236 located in end-block 204 provides separation between vacuum and water. A bearing 240 in end-block 204 also supports target cylinder 210 while allowing rotation of target cylinder 210.

In addition, a static contact plate 242 in end-block 204 is in electrical communication with power bus 232, as depicted in FIG. 6. The static contact plate 242 electrically communicates with a rotary contact plate 244 on a target flange of target cylinder 210 such that power is transmitted to target cylinder 210.

As illustrated in FIGS. 4 and 5, a rotation drive motor 248 is operatively coupled to end-block 202 to impart rotating motion to target cylinder 210. The drive motor 248 engages with a rotation drive belt 252 that extends into end-block 202 as part of the rotation drive apparatus for target cylinder 210. As depicted in FIG. 5, end-block 202 houses a rotary drive shaft 260 that is operatively coupled to target cylinder 210. A drive gear 262 is connected to drive belt 252 and is hobbed into drive shaft 260.

Figure 7:
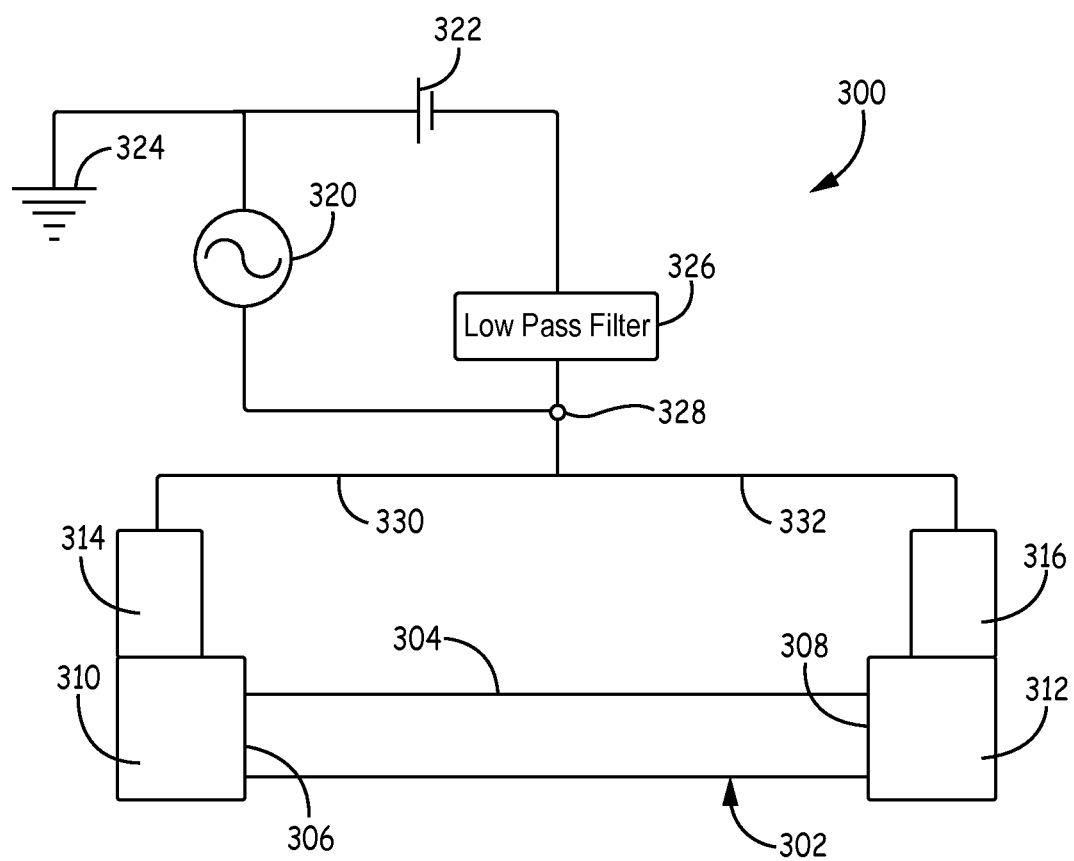
FIG. 7 is a schematic diagram of a power circuit according to one embodiment, which provides substantially equal conductance paths for a rotary sputtering cathode assembly.

FIG. 7 illustrates a power circuit 300 according to one embodiment, which provides substantially equal conductance paths for a rotary sputtering cathode assembly 302. The rotary sputtering cathode assembly 302 includes a rotatable target cylinder 304 having a first end 306 and an opposing second end 308. A first end-block 310 is coupled to first end 306, and a second end-block 312 is coupled to second end 308. The first end-block 310 houses a first power transfer apparatus configured to carry RF power to first end 306, and second end-block 312 houses a second power transfer apparatus configured to carry RF power to second end 308. The first end-block 310 is coupled to a first power supply bus 314, and second end-block 312 is coupled to a second power supply bus 316.

As shown in FIG. 7, an RF power supply 320 and a DC power supply 322 are coupled to a common ground connection 324. The positive lead on DC power supply 322 may also optionally be connected to a separate floating anode inside a chamber of cathode assembly 302. The negative terminal of DC power supply 322 is connected to a low pass filter 326, which prevents the RF signal from entering DC power supply 322. The output terminal of RF power supply 320 is connected to a conductor 328 that is joined by the output from low pass filter 326. The conductor 328 is split into two separate conductors 330 and 332 of substantially equal length, which respectively terminate at power supply busses 314 and 316. The power circuit 300 allows target cylinder 304 to be powered from both of ends 306 and 308 simultaneously during a sputtering operation.

EXAMPLE EMBODIMENTS

Example 1 includes a rotary sputtering cathode assembly comprising a rotatable target cylinder having a first end and an opposing second end; a first power transfer apparatus configured to carry radio frequency (RF) power to the first end of the target cylinder; and a second power transfer apparatus configured to carry RF power to the second end of the target cylinder; wherein RF power signals are simultaneously delivered to both of the first and second ends of the target cylinder during a sputtering operation.

Example 2 includes the rotary sputtering cathode assembly of Example 1, further comprising a first end-block located at the first end and a second end-block located at the second end, the first and second end-blocks respectively housing the first and second power transfer apparatus.

Example 3 includes the rotary sputtering cathode assembly of any of Examples 1-2, wherein the first and second power transfer apparatus each transmits power from a static element to the target cylinder.

Example 4 includes the rotary sputtering cathode assembly of any of Examples 1-3, wherein the first power transfer apparatus communicates with a first RF power source connected to the first end, and the second power transfer apparatus communicates with a second RF power source connected to the second end.

Example 5 includes the rotary sputtering cathode assembly of Example 4, wherein the first and second RF power sources are synchronized.

Example 6 includes the rotary sputtering cathode assembly of any of Examples 1-3, wherein the first power transfer apparatus and the second power transfer apparatus both communicate with a single RF power source.

Example 7 includes the rotary sputtering cathode assembly of Example 6, wherein the first power transfer apparatus and the second power transfer apparatus provide substantially equal conductance paths from the single RF power source to each end of the target cylinder.

Example 8 includes the rotary sputtering cathode assembly of any of Examples 6-7, further comprising a power splitter coupled to the single RF power source and configured to provide substantially equal current to each end of the target cylinder.

Example 9 includes the rotary sputtering cathode assembly of any of Examples 1-8, wherein the target cylinder includes a target sputtering material comprising a transparent conductive oxide.

Example 10 includes the rotary sputtering cathode assembly of Example 9, wherein the transparent conductive oxide comprises indium tin oxide.

Example 11 includes the rotary sputtering cathode assembly of any of Examples 1-10, wherein one or more additional power signals are superimposed on the RF power signals.

Example 12 includes the rotary sputtering cathode assembly of Example 11, wherein the one or more additional power signals comprise direct current (DC) power signals.

Example 13 includes a rotary sputtering cathode assembly comprising a rotatable target cylinder having a first end and an opposing second end; a first end-block connected to the first end of the target cylinder; a first power transfer apparatus operatively coupled to the first end-block and configured to carry radio frequency (RF) power signals to the first end of the target cylinder, the first power transfer apparatus including a first static conductive element in contact with a first rotary conductive element connected to the target cylinder; a second end-block coupled to the second end of the target cylinder; and a second power transfer apparatus operatively coupled to the second end-block and configured to carry RF power signals to the second end of the target cylinder, the second power transfer apparatus including a second static conductive element in contact with a second rotary conductive element connected to the target cylinder; wherein the RF power signals are simultaneously delivered to both of the first and second ends of the target cylinder during a sputtering operation.

Example 14 includes the rotary sputtering cathode assembly of Example 13, wherein the first power transfer apparatus communicates with a first RF power source connected to the first end, and the second power transfer apparatus communicates with a second RF power source connected to the second end.

Example 15 includes the rotary sputtering cathode assembly of Example 14, wherein the first and second RF power sources are synchronized.

Example 16 includes the rotary sputtering cathode assembly of Example 13, wherein the first power transfer apparatus and the second power transfer apparatus are both coupled with a single RF power source.

Example 17 includes the rotary sputtering cathode assembly of Example 16, wherein the first power transfer apparatus and the second power transfer apparatus provide substantially equal conductance paths from the single RF power source to each end of the target cylinder.

Example 18 includes the rotary sputtering cathode assembly of any of Examples 13-17, wherein the first power transfer apparatus and the second power transfer apparatus are located in cooling water of the target cylinder.

Example 19 includes the rotary sputtering cathode assembly of any of Examples 13-18, wherein the first end-block is at cathode potential.

Example 20 includes the rotary sputtering cathode assembly of any of Examples 13-19, wherein the target cylinder includes a target sputtering material comprising a transparent conductive oxide.

While a number of embodiments have been described, it will be understood that the described embodiments are to be considered only as illustrative and not restrictive, and that various modifications to the described embodiments may be made without departing from the scope of the invention. The scope of the invention is therefore indicated by the appended claims rather than by the foregoing description. All changes that come within the meaning and range of equivalency of the claims are to be embraced within their scope.

What is claimed is:
1. A rotary sputtering cathode assembly, comprising:
a rotatable target cylinder having a first end and an opposing second end;
a first end-block connected to the first end of the rotatable target cylinder, wherein the first end block includes a first set of rotary water seals configured to provide separation between water and atmosphere, and a first set of rotary vacuum seals configured to provide separation between vacuum and atmosphere;
a first power transfer apparatus operatively coupled to the first end-block and configured to carry radio frequency (RF) power signals to the first end of the rotatable target cylinder, the first power transfer apparatus including a first power supply bus and a first static conductive element coupled to the first power supply bus, wherein the first static conductive element is in contact with a first rotary electrical contact connected to the rotatable target cylinder;
a second end-block coupled to the second end of the rotatable target cylinder, wherein the second end block includes a second set of rotary water seals configured to provide separation between water and atmosphere, a second set of rotary vacuum seals configured to provide separation between vacuum and atmosphere;

a second power transfer apparatus operatively coupled to the second end-block and configured to carry RF power signals to the second end of the rotatable target cylinder, the second power transfer apparatus including a second power supply bus and a second static conductive element coupled to the second power supply bus, wherein the second static conductive element is in contact with a second rotary electrical contact connected to the rotatable target cylinder; and an RF power supply and a direct current (DC) power supply both coupled to the first and second power supply busses, wherein the RF power supply and the DC power supply are coupled to a common ground connection, wherein an output of the RF power supply is connected to an output conductor and an output of the DC power supply is connected to a low pass filter, the output conductor joined by an output from the low pass filter;

wherein the first and second power supply busses are respectively coupled to first and second input conductors, which are each coupled to the output conductor by a power splitter;

wherein the RF power signals from the RF power supply and DC power signals from the DC power supply are configured to simultaneously be delivered from the output conductor to the first and second power supply busses, to the first and second static conductive elements, to the first and second rotary electrical contacts, and to both of the first and second ends of the rotatable target cylinder during a sputtering operation.

2. The rotary sputtering cathode assembly of claim 1, wherein the first power transfer apparatus and the second power transfer apparatus are located in cooling water of the rotatable target cylinder.

3. The rotary sputtering cathode assembly of claim 1, wherein the first end- block is at cathode potential.

4. The rotary sputtering cathode assembly of claim 1, wherein the rotatable target cylinder includes a target sputtering material comprising a transparent conductive oxide.

5. The rotary sputtering cathode assembly of claim 4, wherein the transparent conductive oxide comprises indium tin oxide.

6. The rotary sputtering cathode assembly of claim 1, wherein the first end block further includes a first set of bearings configured to support the rotatable target cylinder while allowing rotation of the rotatable target cylinder relative to the first end-block, and the second end block further includes a second set of bearings configured to support the rotatable target cylinder while allowing rotation of the rotatable target cylinder relative to the second end-block.

7. The rotary sputtering cathode assembly of claim 1, wherein the first power transfer apparatus and the second power transfer apparatus provide substantially equal conductance paths from the RF power supply to each end of the rotatable target cylinder.

8. The rotary sputtering cathode assembly of claim 1, wherein the first power transfer apparatus and the second power transfer apparatus are configured to provide substantially equal current to each end of the rotatable target cylinder.

9. The rotary sputtering cathode assembly of claim 1, wherein the first and second input conductors are of substantially equal length, wherein the first and second input conductors respectively terminate at the first and second power supply busses.

10. The rotary sputtering cathode assembly of claim 1, wherein a negative terminal of the DC power supply is connected to the low pass filter, which prevents an RF power signal from entering the DC power supply.

* * * * *